(12) United States Patent
Murry et al.

(10) Patent No.: US 7,514,932 B2
(45) Date of Patent: Apr. 7, 2009

(54) METHOD OF RECOGNIZING SIGNAL MIS-WIRING OF A THREE-PHASE CIRCUIT

(75) Inventors: Michael W. Murry, Onalaska, WI (US); Matthew A. Shepeck, Holmen, WI (US); Dennis L. Justin, La Crosse, WI (US)

(73) Assignee: Trane International Inc., Piscataway, NJ (US)

( * ) Notice: Subject to any disclaimer, the term of this patent is extended or adjusted under 35 U.S.C. 154(b) by 51 days.

(21) Appl. No.: 11/649,542

(22) Filed: Jan. 4, 2007

(65) Prior Publication Data

US 2008/0167826 A1    Jul. 10, 2008

(51) Int. Cl.
*G01R 31/00* (2006.01)

(52) U.S. Cl. .................. 324/508; 340/635; 340/651; 340/658; 324/86; 361/44; 361/47; 361/65; 361/185

(58) Field of Classification Search ............... 324/508
See application file for complete search history.

(56) References Cited

U.S. PATENT DOCUMENTS

| | | | |
|---|---|---|---|
| 4,086,466 A * | 4/1978 | Scharlack | 219/494 |
| 4,751,653 A | 6/1988 | Junk et al. | |
| 5,062,278 A | 11/1991 | Sugiyama | |
| 5,434,738 A | 7/1995 | Kurszewski et al. | |
| 5,914,663 A * | 6/1999 | Whitehead | 340/638 |
| 6,341,493 B1 | 1/2002 | Shepeck et al. | |
| 2004/0181718 A1* | 9/2004 | Long | 714/724 |
| 2006/0215335 A1* | 9/2006 | Deshpande et al. | 361/42 |
| 2008/0116877 A1* | 5/2008 | Giubbini et al. | 324/84 |

* cited by examiner

*Primary Examiner*—Timothy J Dole
*Assistant Examiner*—Benjamin M Baldridge
(74) *Attorney, Agent, or Firm*—William O'Driscoll

(57) ABSTRACT

A signal analyzer for calculating the power consumption and power factor of a three-phase power system driving a motor includes logic that determines whether the analyzer's own input terminals are wired in a proper or inverted manner. To do this, the signal analyzer observes a pattern of zero crossing slope values of the three line-to-line voltages of the three-phase power system and observes a pattern of zero crossing slope values of the current in the three power lines. The analyzer also compares the slope of a voltage signal as the signal passes through zero volts and the sign of a corresponding current signal that exists as the voltage signal crosses zero volts. Based on the observed voltage and current patterns and the voltage-to-current relationships, the analyzer can positively identify which of a plurality of inputs or signal wires are inverted.

20 Claims, 5 Drawing Sheets

FIG. 9

| Vab | Vbc | Vca | Ia | Ib | Ic | Vab-Ic | Vbc-Ia | Vca-Ib | Condition |
|---|---|---|---|---|---|---|---|---|---|
|  |  |  |  |  |  |  |  |  | Proper signal relationship |
|  |  |  |  |  |  | X | X | X | Ia, Ib, and Ic Inverted or Shift |
|  |  |  |  |  | X |  | X | X | Ia and Ib Inverted |
|  |  |  |  |  | X | X |  |  | Ic Inverted |
|  |  |  |  | X |  |  |  | X | Ib Inverted |
|  |  |  |  |  | X | X | X |  | Ia and Ic Inverted |
|  |  |  | X |  |  |  | X |  | Ia Inverted ← 122 |
|  |  |  |  | X |  | X |  | X | Ib and Ic Inverted ← 140 |
|  |  | X |  |  |  |  |  | X | Vca Inverted |
|  |  | X |  |  |  | X | X |  | Vab and Vbc Inverted |
|  |  | X |  | X |  |  | X |  | Vab, Vbc, and Ic Inverted |
|  |  | X |  |  | X | X |  | X | Vca and Ic Inverted |
|  |  | X |  | X |  |  |  |  | Vca and Ib Inverted |
|  |  | X |  | X |  | X | X | X | Vab, Vbc, and Ib Inverted |
|  |  | X | X |  |  |  | X | X | Vca and Ia Inverted |
|  |  | X | X |  |  | X |  |  | Vca, Ib, and Ic Inverted |
|  | X |  |  |  |  |  | X |  | Vbc Inverted |
|  | X |  |  |  |  | X |  | X | Vab and Vca Inverted |
|  | X |  |  | X |  |  |  | X | Vbc, Ia, and Ib Inverted |
|  | X |  |  |  | X | X | X | X | Vbc and Ic Inverted |
|  | X |  |  | X |  |  | X | X | Vbc and Ib Inverted |
|  | X |  |  | X |  | X |  |  | Vab, Vca, and Ib Inverted |
|  | X |  | X |  |  |  |  |  | Vbc, and Ia Inverted |
|  | X |  | X |  |  | X | X | X | Vab, Vca, and Ia Inverted |
| X |  |  |  |  |  |  | X | X | Vbc and Vca Inverted |
| X |  |  |  |  |  | X |  |  | Vab Inverted ← 100 |
| X |  |  |  |  | X | X | X | X | Vbc, Vca, and Ic Inverted |
| X |  |  |  | X |  |  | X |  | Vab, Ia, and Ic Inverted |
| X |  |  |  | X |  | X |  | X | Vab and Ib Inverted |
| X |  | X |  |  |  |  |  | X | Vbc, Vca, and Ia Inverted |
| X |  |  | X |  |  | X | X |  | Vab and Ia Inverted |
| X |  |  |  |  | X |  |  |  | Vab and Ic Inverted |

METHOD OF RECOGNIZING SIGNAL MIS-WIRING OF A THREE-PHASE CIRCUIT

BACKGROUND OF THE INVENTION

1. Field of the Invention

The subject invention generally pertains to signal wiring used in monitoring a three-phase electrical power system. The invention more specifically applies to a method for determining whether the signal wiring is properly connected to the power system.

2. Description of Related Art

There are many available systems for determining whether a three-phase electrical power supply is properly connected to its load. The invention, however, actually pertains to the proper wiring of signal wires, not the proper wiring of the power lines.

Once a three-phase power supply is properly wired to its load, a control circuit can monitor the line voltage and current of all three phases to determine the system's power consumption and power factor. Six pairs of signal wires (three for the voltage readings and three for the current) can be used to couple the control circuit to the power lines. It is important for the signal wires to be properly wired. Otherwise, if one or more signal wires are inverted, the control will likely calculate incorrect values for the power consumption and power factor. In some cases, the control might even shut the system down unnecessarily.

When such problems occur, identifying the source of the problem or even recognizing the problem exists can be difficult and can result in costly service calls. Moreover, once the signal wiring is identified as causing the problem, it can be difficult to determine exactly which signal wires are wired incorrectly.

Consequently, there is a need for a system that can determine whether signal wiring used in monitoring a three-phase power system is properly wired; wherein the system preferably identifies any inverted pairs of wires that may exist.

SUMMARY OF THE INVENTION

It is an object of the present invention to provide a three-phase power monitoring system that determines whether its own signal wiring is properly wired.

It is another object of some embodiments to specifically identify which of a plurality of signal wires are inverted or mis-wired.

It is another object of some embodiments to display values of power consumption and power factor and do so with confidence knowing that the signal wiring is properly wired.

It is another object of some embodiments to determine signal mis-wiring by observing the pattern of zero-crossing slope values of the three line-to-line voltages of a three-phase power system.

It is another object of some embodiments to determine signal mis-wiring by observing the pattern of zero-crossing slope values of the current conveyed by three power lines of a three-phase system.

It is another object of some embodiments to determine signal mis-wiring by observing the slope of a voltage signal as the signal passes through zero volts and comparing that slope to the sign of a corresponding current signal that exists as the voltage signal crosses zero volts.

It is another object of some embodiments to provide a monitoring mechanism that calculates the power consumption of a three-phase system and determines whether the circuit's own signal wiring is properly wired.

It is another object of some embodiments to provide a monitoring mechanism that calculates the power factor of a three-phase system and determines whether the circuit's own signal wiring is properly wired.

One or more of these and/or other objects of the invention are provided by a three-phase power monitoring system that determines whether its own signal wiring is properly wired based upon (1) an observed pattern of zero crossing slope values of the three line-to-line voltages of the three-phase power system, (2) an observed pattern of zero crossing slope values of the current in the three power lines, and (3) a comparison the slope of a voltage signal as the signal passes through zero volts and the sign of a corresponding current signal that exists as the voltage signal crosses zero volts.

BRIEF DESCRIPTION OF THE DRAWINGS

FIG. 9 is a table illustrating the logic for identifying which of a plurality of voltage or current signals are inverted. Like elements are denoted by like number in the various Figures.

DESCRIPTION OF THE PREFERRED EMBODIMENT

Figure 1:
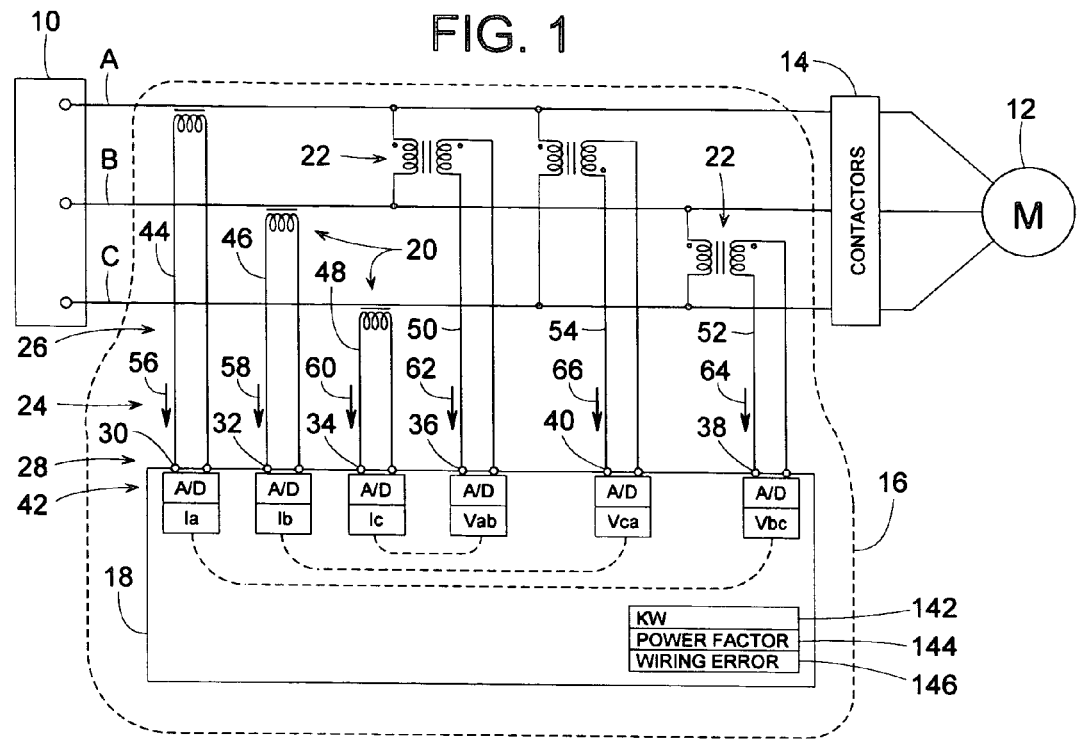
FIG. 1 is a schematic diagram of a three-phase electrical system whose signal wires are properly wired.

FIG. 1 shows a plurality of electrical power lines (power lines A, B and C) conveying electrical power from a three-phase power supply 10, through a set of contactors 14 (e.g. conventional motor contactors), and onto an electrical load 12 (e.g., an electric motor). To calculate the electrical load's three-phase power consumption and related power factor, an electrical system 16 with a monitoring mechanism 18 (such as a microprocessor-based circuit 18, a single logic circuit, a programmable logic module, or equivalent thereof) monitors the voltage and current of power lines A, B and C. The monitoring mechanism is described herein in connection with the microprocessor based circuit 18 but also contemplates the equivalents thereto. Microprocessor-based circuit 18 is schematically illustrated to represent any circuit that can execute a desired programmed algorithm suitable for the subject invention. Examples of microprocessor-based circuit 18 include, but are not limited to, a computer, PLC (programmable logic controller), and the like. In some embodiments, circuit 18 includes an Atmegal28 microcontroller, provided by Atmel Corporation.

Figure 3:
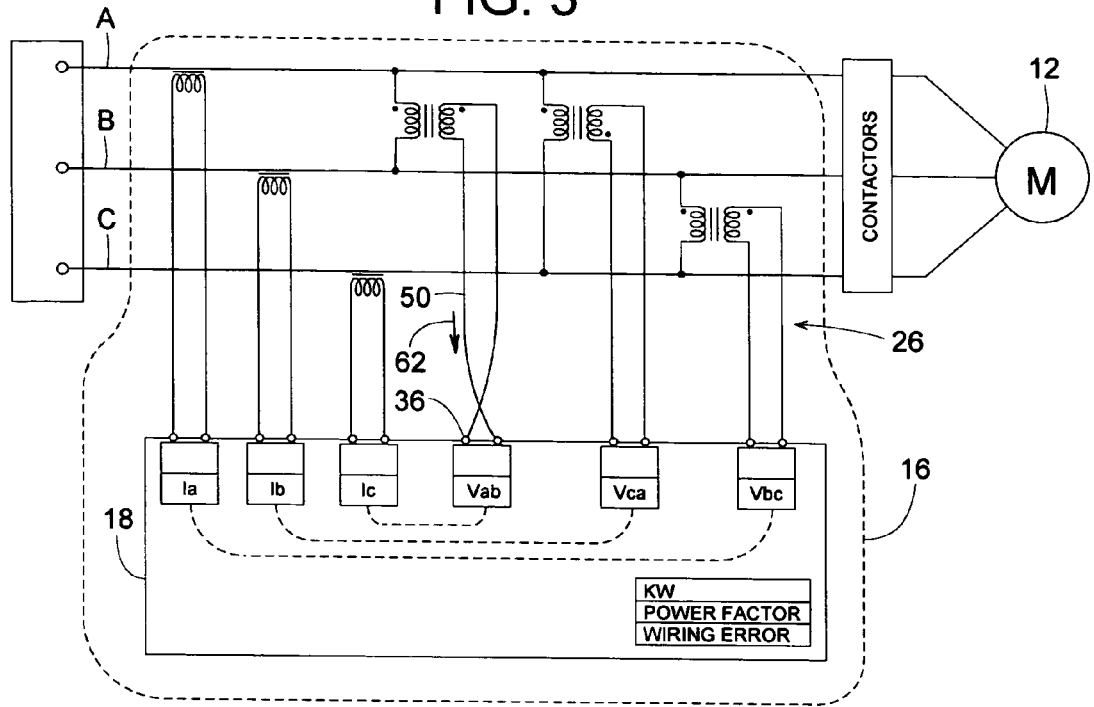
FIG. 3 is a schematic diagram similar to FIG. 1 but with one inverted pair of voltage signal wires.
Figure 5:
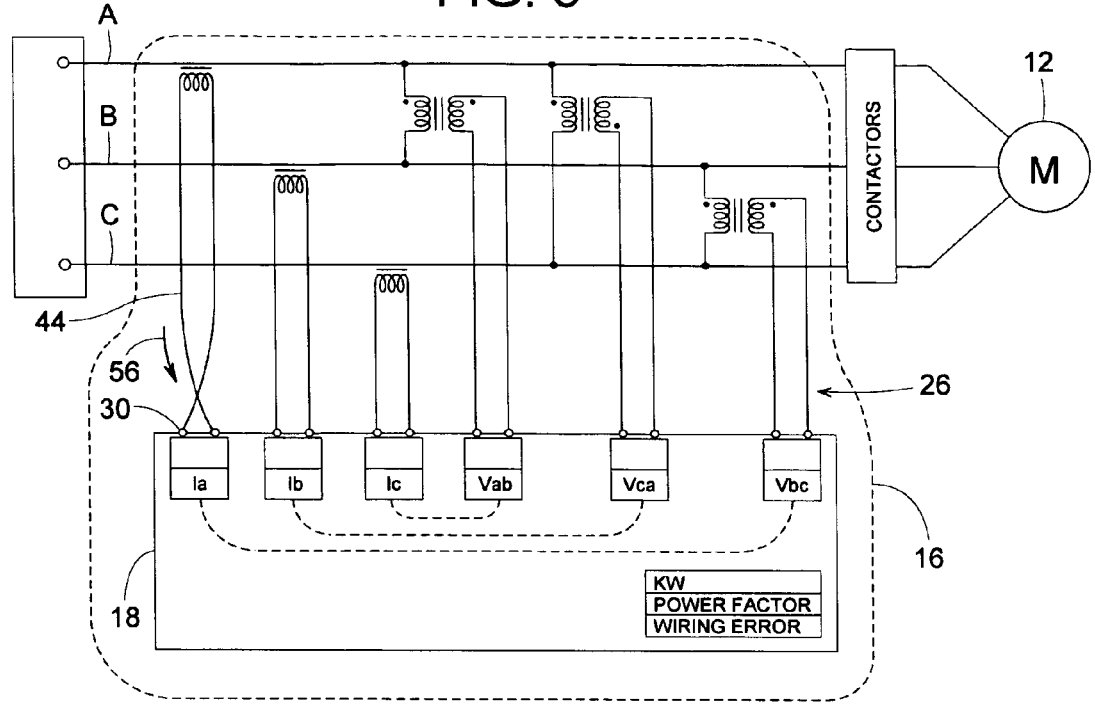
FIG. 5 is a schematic diagram similar to FIG. 1 but with one inverted pair of current signal wires.
Figure 7:
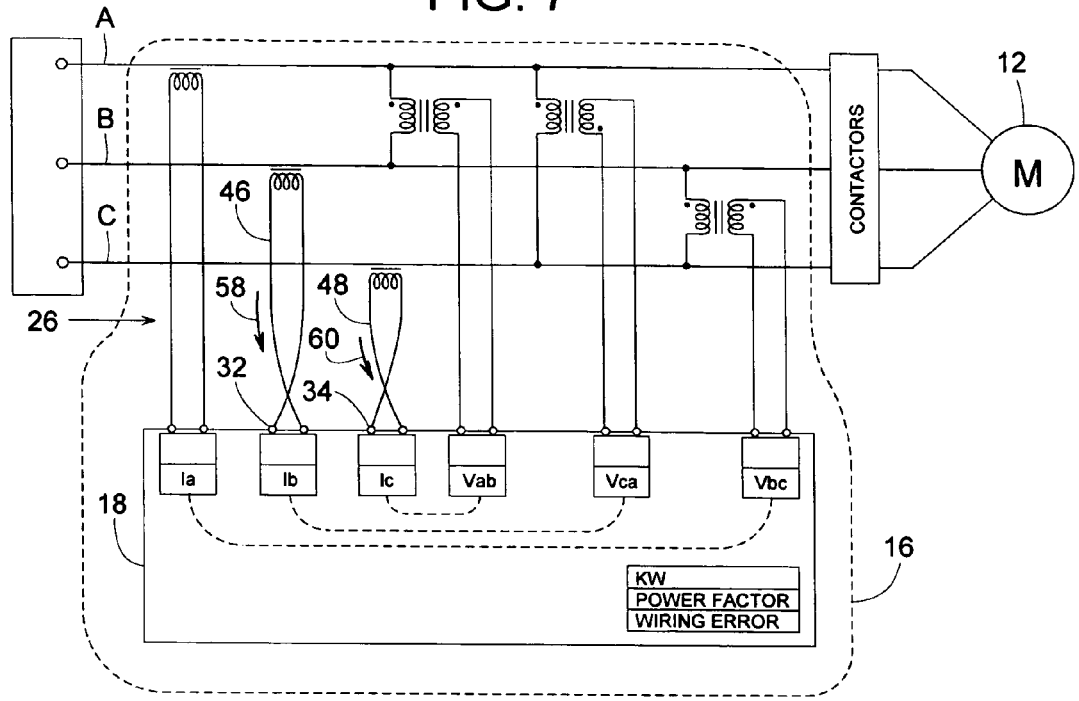
FIG. 7 is a schematic diagram similar to FIG. 1 but with two inverted pairs of current signal wires.

To monitor power lines A, B and C, system 16 includes conventional voltage/current pickup devices (e.g., toroidal current transformers 20 or a voltage signal transformers 22) that generate a plurality of signals 24 reflecting the voltage and current in lines A, B and C. A plurality of signal wires 26 convey signals 24 to a plurality of inputs 28 including an Ia input 30, an Ib input 32, an Ic input 34, a Vab input 36, a Vbc input 38 and a Vca input 40. Conventional analog to digital converters 42 digitize signals 24 so that signals 24 can be processed by microprocessor-based circuit 18. In processing signals 24, circuit 18 applies programmed calculations and logic to determine whether signal wires 26 are installed properly as shown in FIG. 1 or whether some are mis-wired in an inverted manner (reverse polarity) as shown in FIGS. 3, 5 and 7.

Signal wires 26 include a signal-Ia wire 44, a signal-Ib wire 46, a signal-Ic wire 48, a signal-Vab wire 50, a signal-Vbc wire 52, and a signal-Vca wire 54. Signal-Ia wire 44 conveys a signal-Ia 56 representing the current in line A, signal-Ib wire 46 conveys a signal-Ib 58 representing the current in line B, signal-Ic wire 48 conveys a signal-Ic 60 representing the current in line C, signal-Vab wire 50 conveys a signal-Vab 62 representing the voltage between lines A and B, signal-Vbc wire 52 conveys a signal-Vbc 64 representing the voltage between lines B and C, and signal-Vca wire 54 conveys a signal-Vca 66 representing the voltage between lines C and A. Signal wires 44, 46, 48, 50, 52 and 54 respectively convey signals 56, 58, 60, 62, 64 and 66 to inputs 30, 32, 34, 36, 38 and 40.

Figure 2:
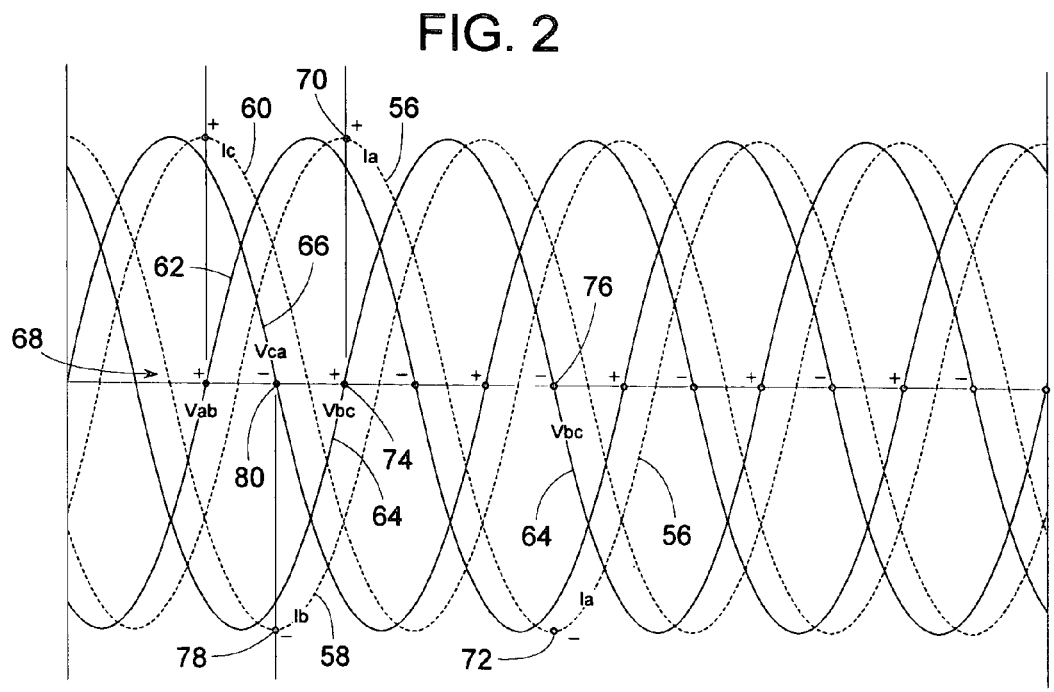
FIG. 2 is a plot of the voltage and current signals of the system shown in FIG. 1.

As microprocessor-based circuit 18 observes signals 24 over a period of a few cycles, circuit 18 can identify patterns and signal relationships that indicate whether signal wires 26 are installed properly or whether some are wired in an inverted manner. When load 12 is operating at or near a unity power factor and signal wires 26 are properly wired according to FIG. 1, the amplitude and phase relationship of signals 56, 58, 60, 62, 64 and 66 can be as shown in FIG. 2.

In this case, the three monitored line-to-line voltages (signal-Vab 62, signal-Vbc 64 and signal-Vca 66) will pass through zero volts in alternating directions to create a pattern of zero-crossing slope values 68 that alternate between positive and negative. For example, the three voltages Vab, Vbc and Vca will pass through zero volts with their slopes being in the following order: Vab (positive slope), Vca (negative slope), Vbc (positive slope), Vab (negative slope), Vca (positive slope), Vbc (negative slope), etc. The same applies to the three monitored line currents by substituting Ia, Ib and Ic for Vab, Vbc and Vca.

Also, in a properly wired balanced three-phase system at a unitary power factor, Ia leads Vbc by 90 degrees, Ib leads Vca by 90 degrees and Ic leads Vab by 90 degrees. Therefore microprocessor-based circuit 18 can check the proper relationship between these three voltage-current pairs by checking the sign of the current signals when their corresponding voltage signal crosses zero volts. In the properly wired cases, Ia is positive (point 70) when Vbc crosses zero volts with a positive slope (point 74), and Ia is negative (point 72) when Vbc crosses zero volts with a negative slope (point 76). Likewise, Ib is positive when Vca crosses zero volts with a positive slope, and Ib is negative (point 78) when Vca crosses zero volts with a negative slope (point 80). The same is true for Ic and Vab.

Figure 4:
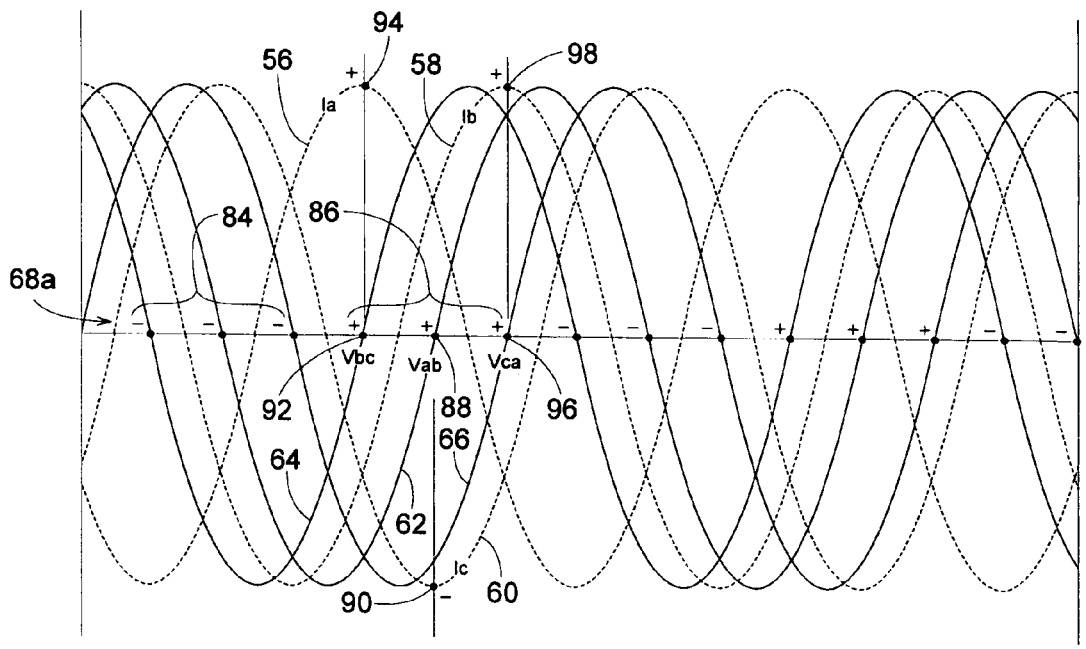
FIG. 4 is a plot of the voltage and current signals of the system shown in FIG. 3.

If system 16 is properly wired except for Vab input 36 or its corresponding signal-Vab wire 50 being connected in an inverted manner, as shown in FIG. 3, the amplitude and phase relationship of signals 56, 58, 60, 62, 64 and 66 will be as shown in FIG. 4. When a monitored voltage signal is inverted relative to the other two voltage signals, the resulting pattern of zero crossing slope values 68a will change to three consecutive negative slope crossings 84 followed by three consecutive positive slope crossings 86. The middle voltage signal in the pattern of three similar zero crossings is the signal that is inverted relative to the other two voltage signals. In this case, the middle one is signal-Vab, which means either Vab is inverted or Vab is correct and Vbc and Vca are inverted.

To determine whether the problem is with Vab or with Vbc and Vca, microprocessor-based circuit 18 examines the voltage current relationships of Vab-Ic, Vbc-Ia, and Vca-Ib. A relationship is correct when a voltage signal has a zero crossing slope (positive or negative) that matches the polarity (positive or negative) of that voltage signal's corresponding and coincident current signal. In FIG. 4, Vab has a positive slope at a point 88 while Ic is negative at that time (point 90), so the relationship of Vab-Ic is improper. Vbc has a positive slope at a point 92 and Ia is positive at that time (point 94), so the relationship of Vbc-Ia is correct. Vca has a positive slope at a point 96 and Ib is positive at that time (point 98), so the relationship of Vca-Ib is also correct. With Vab being inverted relative to the other two voltage signals and the relationship of Vab-Ic being improper, microprocessor-based circuit 18 applies the logic shown in FIG. 9 to determine that Vab is in fact inverted as indicated by a row 100 of FIG. 9. In FIG. 9, an "X" indicates an inverted or improper state, while a blank indicates a proper condition. A far right column 102 indicates the condition based on the proper or inverted states of signals Vab, Vbc, Vca, Ia, Ib and Ic plus the proper or improper relationships of Vab-Ic, Vbc-Ia and Vca-Ib.

It should be noted that although the results tabulated in columns 104 are based on comparing the slopes of zero crossing voltage signals to the sign of corresponding current signals, the same results could be achieved by comparing the slopes of zero crossing current signals to the sign of corresponding voltage signals.

Figure 6:
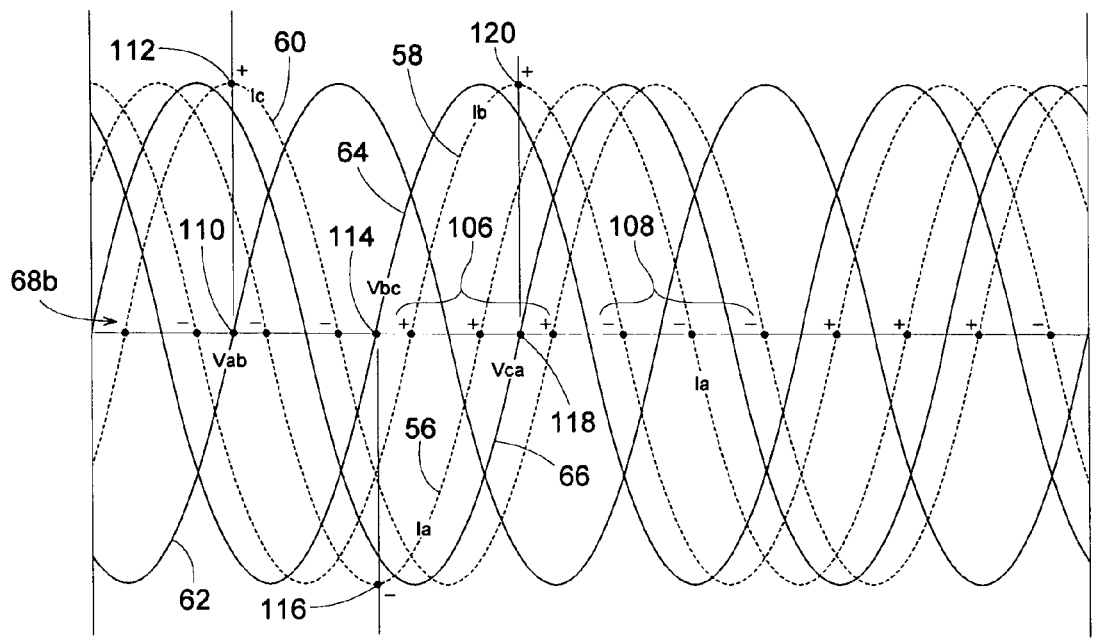
FIG. 6 is a plot of the voltage and current signals of the system shown in FIG. 5.

In another example, if system 16 is properly wired except for Ia input 30 or its corresponding signal-Ia wire 44 being connected in an inverted manner, as shown in FIG. 5, the amplitude and phase relationship of signals 56, 58, 60, 62, 64 and 66 will be as shown in FIG. 6. When a monitored current signal is inverted relative to the other two current signals, the resulting pattern of zero crossing slope values 68b for those current signals will change to three consecutive positive slope crossings 106 followed by three consecutive negative slope crossings 108. The middle current signal in the pattern of three similar zero crossings is the signal that is inverted relative to the other two current signals. In this case, the middle one is signal-Ia, which means either Ia is inverted or Ia is correct and Ib and Ic are inverted.

To determine whether the problem is with Ia or with Ib and Ic, microprocessor-based circuit 18 again examines the voltage current relationships of Vab-Ic, Vbc-Ia, and Vca-Ib. In FIG. 6, Vab has a positive slope at a point 110 while Ic is positive at that time (point 112), so the relationship of Vab-Ic is correct. Vbc has a positive slope at a point 114 and Ia is negative at that time (point 116), so the relationship of Vbc-Ia is improper. Vca has a positive slope at a point 118 and Ib is positive at that time (point 120), so the relationship of Vca-Ib is correct. With Ia being inverted relative to the other two current signals and the relationship of Vbc-Ia being improper, microprocessor-based circuit 18 applies the logic shown in FIG. 9 to determine that Ia is in fact inverted, as indicated by a row 122 of FIG. 9.

Figure 8:
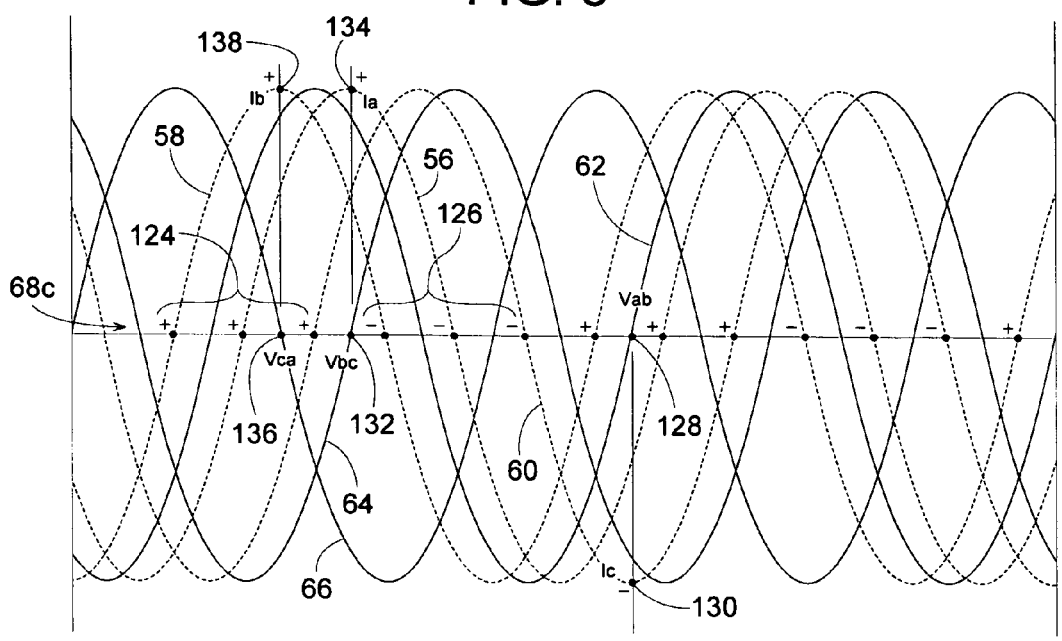
FIG. 8 is a plot of the voltage and current signals of the system shown in FIG. 7.

In yet another example, if system 18 is properly wired except for Ib input 32 and Ic input 34 or their corresponding signal-Ib wire 46 and signal-Ic wire 48 both being connected in an inverted manner, as shown in FIG. 7, the amplitude and phase relationship of signals 56, 58, 60, 62, 64 and 66 will be as shown in FIG. 8. As mentioned earlier, when a monitored current signal is inverted relative to the other two current signals, the resulting pattern of zero crossing slope values 68c for those current signals will change to three consecutive positive slope crossings 124 followed by three consecutive negative slope crossings 126, and the middle current signal in the pattern of three similar zero crossings is the signal that is inverted relative to the other two current signals. In this case, the middle one is signal-Ia, which means either Ia is inverted or Ia is correct and Ib and Ic are inverted.

To determine whether the problem is with Ia or with Ib and Ic, microprocessor-based circuit 18 again examines the voltage current relationships of Vab-Ic, Vbc-Ia, and Vca-Ib. In FIG. 8, Vab has a positive slope at a point 128 while Ic is negative at that time (point 130), so the relationship of Vab-Ic is improper. Vbc has a positive slope at a point 132 and Ia is positive at that time (point 134), so the relationship of Vbc-Ia is correct. Vca has a negative slope at a point 136 while Ib is positive at that time (point 138), so the relationship of Vca-Ib is improper. With Ia being inverted relative to the other two current signals and the relationships of both Vab-Ic and Vca-Ib being improper, microprocessor-based circuit 18 applies the logic shown in FIG. 9 to determine that Ib and Ic are inverted, as indicated by a row 140 of FIG. 9.

Even though there are many different ways of mis-wiring signal wires 26 to inputs 28, FIG. 9 illustrates how each unique wiring configuration can be positively identified by microprocessor-based circuit 18 observing and evaluating the pattern of zero crossing slope values for Vab, Vbc and Vca; the pattern of zero crossing slope values for Ia, Ib and Ic; and the slope-to-polarity relationships of Vab-Ic, Vbc-Ia and Vca-Ib. FIG. 9 also illustrates how circuit 18 can even identify Ia, Ib and Ic being inverted or a shift condition. A "shift" is defined as a condition in which the voltage and current signals are in the proper order and polarity but have a 120-degree rotational offset.

In some cases, microprocessor-based circuit 18 includes a power consumption display 142 (FIG. 1), a power factor display 144, and a message 146 that identifies whether signal wiring 26 is proper or mis-wired. If an improper wiring condition exists, message 146 indicates which particular signals, signal wires or inputs are incorrect.

Although the invention is described with respect to a preferred embodiment, modifications thereto will be apparent to those of ordinary skill in the art. The scope of the invention, therefore, is to be determined by reference to the following claims.

The invention claimed is:

1. An electrical system for monitoring a plurality of power lines that deliver current and voltage from a three-phase power supply to an electrical load, wherein the plurality of power lines includes a power-line-A, a power-line-B, and a power-line-C, the electrical system comprising:
    a plurality of signal wires connectable to the plurality of power lines and conveying a first set of signals and a second set of signals; and
    a monitoring mechanism having a plurality of inputs connected to the plurality of signal wires, at least one input of the plurality of inputs can be selectively wired to the plurality of signal wires in a proper manner and an inverted manner, wherein the monitoring mechanism compares a zero-crossing slope value of at least one of the first set of signals to a polarity of at least one of the second set of signals and upon doing so executes logic that determines whether the at least one input is wired in the inverted manner as opposed to the proper manner.

2. The electrical system of claim 1, wherein the monitoring mechanism determines whether the at least one input is wired in the inverted manner as opposed to the proper manner based on the first set of signals and/or the second set of signals creating a pattern that is characteristic of the at least one input being wired in the inverted manner.

3. The electrical system of claim 2, wherein the pattern is based on a series of zero-crossing slope values of the first set of signals and/or the second set of signals.

4. The electrical system of claim 1, wherein the first set of signals includes the signal-Ia representing current through power-line-A, the signal-Ib representing current through power-line-B, and the signal-Ic representing current through power-line-C.

5. The electrical system of claim 4, wherein the second set of signals includes the signal-Vab representing voltage across the power-line-A and the power-line-B, the signal-Vbc representing voltage across the power-line-B and the power-line-C, and the signal-Vca representing voltage across the power-line-C and the power-line-A.

6. The electrical system of claim 1, wherein the first set of signals includes the signal-Vab representing voltage across the power-line-A and the power-line-B, the signal-Vbc representing voltage across the power-line-B and the power-line-C, and the signal-Vca representing voltage across the power-line-C and the power-line-A.

7. The electrical system of claim 6, wherein the second set of signals includes the signal-Ia representing current through power-line-A, the signal-Ib representing current through power-line-B, the signal-Ic representing current through power-line-C.

8. The electrical system of claim 1, wherein the first set of signals and the second set of signals are generated via current transformers or voltage transformers.

9. An electrical system for coupling a three-phase power supply to an electrical load, the electrical system comprising:
    a plurality of power lines for delivering current and voltage from the three-phase power supply to the electrical load, the plurality of power lines includes a power-line-A, a power-line-B, and a power-line-C;
    a plurality of signal wires coupled to the plurality of power lines and conveying a first set of signals and a second set of signals; and
    a monitoring mechanism having a plurality of inputs connected to the plurality of signal wires, at least one input of the plurality of inputs can be selectively wired to the plurality of signal wires in a proper manner and an inverted manner, wherein the monitoring mechanism observes the first set of signals and the second set of signals and compares zero-crossing slope-values of at least one of the first set of signals to a polarity of at least one of the second set of signals, and wherein the comparison indicates whether the at least one input is wired to the plurality of signal wires in the inverted manner.

10. The electrical system of claim 9, wherein a pattern based on a series of zero-crossing slope values of the first set of signals and/or the second set of signals is utilized to determine whether an input is wired in a manner opposite to the other inputs.

11. The electrical system of claim 9, wherein the first set of signals includes the signal-Ia representing current through power-line-A, the signal-Ib representing current through power-line-B, the signal-Ic representing current through power-line-C.

12. The electrical system of claim 9, wherein the second set of signals includes the signal-Vab representing voltage across the power-line-A and the power-line-B, the signal-Vbc representing voltage across the power-line-B and the power-line-C, and the signal-Vca.

13. A method of determining whether a signal wire of a plurality of signal wires is connected in a proper manner or an inverted manner, the plurality of signal wires conveying a first set of signals including a plurality of voltage signals and a second set of signals including a plurality of current signals from a three-phase power supply to a monitoring mechanism, the first set of signals representing a voltage of the three phase power supply, the second set of signals representing a current of the three-phase power supply, the method comprising:

via the monitoring mechanism, observing for a period the first set of signals and the second set of signals; and via the monitoring device, determining whether the first set of signals and/or the second set of signals that were observed during the period create a pattern of zero crossing slope values and comparing the zero crossing slope value to signal polarity values to indicate the signal wire being connected in the inverted manner.

14. The method of claim 13, wherein the pattern is based on a series of zero-crossing slope values of the plurality of signals.

15. The method of claim 14, further comprising comparing a polarity of a first signal to a zero-crossing slope value of a second signal, wherein the first signal is one of the plurality of current signals, and the second signal is one of the plurality of voltage signals.

16. The method of claim 14, further comprising comparing a polarity of a first signal to a zero-crossing slope value of a second signal, wherein the first signal is one of the plurality of voltage signals, and the second signal is one of the plurality of current signals.

17. A method of determining whether a signal wire of a plurality of signal wires is connected in a correct manner or an inverted manner, the plurality of signal wires convey a plurality of signals from a three-phase power supply, the plurality of signals include a first plurality of signals and a second plurality of signals, each of the first plurality of signals and the second plurality of signals exclusively encompasses one of a plurality of voltage signals and a plurality of current signals that respectively correspond to a voltage and a current of the three-phase power supply, the method comprising:

observing the first plurality of signals;

observing the second plurality of signals;

identifying a pattern created by the first plurality of signals, wherein the pattern is based on a series of zero-crossing slope values of the first plurality of signals;

comparing the series of zero-crossing slope values to a corresponding series of polarity values of the second plurality of signals; and based on the steps of identifying and comparing, determining whether the signal wire is connected in the inverted manner.

18. The method of claim 17, wherein the first plurality of signals is the plurality of voltage signals, and the second plurality of signals is the plurality of current signals.

19. The method of claim 17, wherein the first plurality of signals is the plurality of current signals, and the second plurality of signals is the plurality of voltage signals.

20. The method of claim 17, further comprising digitizing the plurality of signals.

* * * * *